United States Patent [19]

Isa

[11] Patent Number: 5,703,824
[45] Date of Patent: Dec. 30, 1997

[54] SEMICONDUCTOR MEMORY DEVICE

[75] Inventor: Satoshi Isa, Tokyo, Japan

[73] Assignee: NEC Corporation, Tokyo, Japan

[21] Appl. No.: 710,950

[22] Filed: Sep. 24, 1996

[30] Foreign Application Priority Data

Sep. 30, 1995 [JP] Japan .................................. 7-276470

[51] Int. Cl.⁶ .................................................. G11C 29/00
[52] U.S. Cl. ...................... 365/225.7; 365/200; 365/210; 365/203; 365/189.05; 365/189.07
[58] Field of Search .............................. 365/225.7, 200, 365/210, 203, 189.05, 189.07

[56] References Cited

U.S. PATENT DOCUMENTS

| | | | |
|---|---|---|---|
| 5,257,228 | 10/1993 | Sukegawa | 365/200 |
| 5,349,556 | 9/1994 | Lee | 365/200 |

FOREIGN PATENT DOCUMENTS

| | | | |
|---|---|---|---|
| 6187794 | 7/1994 | Japan | G11C 29/00 |
| 6195998 | 7/1994 | Japan | G11C 29/00 |

Primary Examiner—David C. Nelms
Assistant Examiner—Andrew Q. Tran
Attorney, Agent, or Firm—Whitham, Curtis, Whitham & McGinn

[57] ABSTRACT

A semiconductor memory device capable of restricting an increase of a gate capacitance of a substitution address program circuit connected to an address bus and reducing charge/discharge current of the substitution address program circuit to reduce current consumption of a chip and to restrict an increase of time from a time instance when an address signal is input to a time instance when a redundancy selection signal is output is provided. Addresses containing defects are programmed by fuses 2 and a node PRE has a potential swung between a first potential which is lower than a power source potential and higher than a reference potential VREF which is set to an intermediate potential between the power source potential and a ground potential and a second potential lower than the reference potential and higher than the ground potential. A differential amplifier 10 determines a coincidence or non-coincidence of the input address with the program address by comparing the potential of the node PRE with the reference potential and generates a redundancy determination signal RED correspondingly thereto.

16 Claims, 5 Drawing Sheets

5,703,824

SEMICONDUCTOR MEMORY DEVICE

BACKGROUND OF THE INVENTION

1. Field of the Invention

The present invention relates to a semiconductor memory device and, particularly, to a semiconductor memory device equipped with a redundancy circuit.

2. Related Art Description

A conventional semiconductor memory device, for example, a DRAM (Dynamic Random Access Memory), comprises a plurality of memory cells and a plurality of row and column lines for selecting one of the memory cell. In order to make a semiconductor memory chip containing a plurality of memory cells usable even if some of the memory cells are defective, a semiconductor memory device equipped with redundant memory cells and redundant row lines or redundant column lines for substituting the redundant memory cells for the defective memory cells has been realized. A circuit for substituting a redundant memory cell for a defective memory cell is referred to as redundancy circuit.

The redundancy circuit usually has a substitution address program circuit capable of programming an address or addresses to be substituted. A conventional technique related to the substitution address program circuit is disclosed in, for example, Japanese Patent Application Laid-open No. H6-187794 or H6-195998.

FIG. 4 shows a conventional substitution address program circuit. The substitution address program circuit programs a substitution address or addresses by preliminarily opening a fuse 2 or fuses 2 selectively such that, when an address or addresses to be substituted are input to the circuit, a redundancy selection signal RED at an output of the circuit becomes "H" level indicating a selection state.

An operation of the conventional substitution address program circuit will be described with reference to FIG. 4 showing a circuit diagram thereof and FIG. 5 showing waveforms of signals at various portion of the circuit.

First, by making an activation signal REN "L" level, a P channel MOS transistor 4 is turned on and an N channel MOS transistor 3 is turned off. Therefore, a node PRE connected to a drain of the P channel MOS transistor 4 is pre-charged to a source voltage VCC and becomes "H" level.

In this case, an output node ACT of a delay element DELAY1 having an input supplied with the activation signal REN is in "L" level. Therefore, an output of a NAND gate NAND1 having inputs supplied with potentials of the nodes PRE and ACT, respectively, becomes "H" level and a redundancy selection signal RED becomes "L" level indicating non-selection state through an inverter 6.

Then, at a time when address signals X1~XN are input to the substitution address program circuit, the activation signal REN becomes "H" level, so that the N channel MOS transistor 3 becomes conductive (cf. time instance t0 in FIGS. 5(A) and 5(B)).

Since the substitution address program circuit is designed such that, when the input address coincides with a preliminarily programmed address, all of the transistors 1 connected to the fuses 2 which are not opened are turned off, the node PRE is maintained at "H" level (source voltage VCC). On the other hand, the activation signal REN is delayed by the delay element DELAY1 for a predetermined time and the node ACT becomes "H" level (cf. time instance t1 in FIG. 5(B)). Therefore, the NAND gate NAND1 becomes "L" level and the redundancy selection signal RED becomes "H" level indicating the selection state through the inverter 6 (cf. FIG. 5(B)).

A P channel MOS transistor 7 is provided for preventing the node PRE from floating and its current drive performance can be small enough compared with that of the N channel MOS transistor 1.

On the other hand, since, when the input address does not coincide with any of the programmed addresses or when there is no programmed address in the substitution address program circuit, at least one of the transistors 1 connected to the fuses which are not opened is turned on and the N channel transistor 3 is also turned on, the node PRE becomes "L" level (ground potential). Therefore, the NAND gate NAND1 becomes "H" level and the redundancy selection signal RED is maintained at "L" level which indicates the non-selection state, through the inverter 6.

Delay time t1 of the delay element DELAY1 is determined such that there is no hazard given to the node RED. Therefore, it is necessary to make the node ACT "H" level after the potential of the node PRE becomes smaller than a threshold voltage VTN of an N channel MOS transistor constituting the NAND gate NAND1, when the voltage of node PRE changes from 'H' level to 'L' level. Here, a typical voltage of VTN is 1.0v to 0.5v. VTN is determined by a used fabrication process. And it is difficult to set a voltage level of VTN grater than the typical voltage so that the logic circuit operates normally. The timing t1 is determined in this manner (cf. FIGS. 5(A) and 5(B)). As shown in FIG. 4, the redundancy selection signal RED is maintained at "L" level indicating the non-selection state, when either the node ACT or the node PRE is "L" level.

The above described substitution address program circuit is required for each word line to be substituted. Therefore, the address signals X1~XN are input to a plurality of pairs each including one N channel MOS transistor 1 and one inverter 5, respectively. The number of the pairs is corresponding to the number of the substitution address program circuits.

The number of substitution address program circuits mounted on a single memory chip depends upon memory capacity of the memory chip and skill in performing fabrication process of the memory chip, etc. Therefore, though it is generally difficult to affirm, it is assumed for the sake of simplicity of discussion that a chip area is proportional to a memory capacity and the number of substitution address program circuits mounted on the memory chip is also proportional to the memory capacity.

It is further assumed here that a wiring capacitance of an address bus of a memory chip is C and a gate capacitance of a substitution address program circuit connected to the address bus is a % of the wiring capacitance of the address bus.

Under these assumptions, when the memory capacity of the memory chip is made $M^2$ times, the wiring capacitance becomes M×C since the length of the address bus becomes M times. Further, in this case, the gate capacitance of the substitution address program circuit becomes $(a \times M^2 \times C)/100$. Therefore, the gate capacity becomes (a×M) % of the wiring capacitance.

Therefore, even when the gate capacitance of the substitution address program circuit connected to the address bus of a semiconductor memory chip having a certain memory capacity is in the order of 25% (a=25) of the wiring capacitance C of the address bus, the memory capacity of the memory chip after, for example, two generations (it becomes 4 times in one generation) becomes 16 times, so that the radio of the gate capacitance with respect to the wiring capacitance becomes 1 substantially.

Therefore, with increase of the memory chip capacity, the gate capacitance of the substitution address program circuit connected to the address bus is increased and electric current consumption due to charge and discharge of the address bus is increased.

A simple procedure for restricting the increase of the gate capacitance is to simply reduce the size of the N channel MOS transistor 1 used in the substitution address program.

In such case, however, the current drive performance of the N channel MOS transistor 1 is degraded, so that a time for discharging the node PRE of the substitution address program circuit is increased.

Therefore, with the increase of the discharge time of the node PRE, a time from a time instance when the address signal is input to the circuit to a time instance when the redundancy selection signal RED is output therefrom is increased.

However, since, with the recent increase of the operating speed of the DRAM, the inputting cycle of the address signal is shortened, the above-mentioned procedure can not be employed simply.

Further, the node PRE of the substitution address program circuit is swung between the source potential and the ground potential.

Charge/discharge current I in such case is represented by the following equation:

$$I=(C \times V)/t \quad (1)$$

where C is a sum of a gate capacitance, diffusion layer capacitance and parasitic capacitance, V is the source voltage and t is an address input cycle.

Therefore, the number of substitution address program circuits is increased, the charge/discharge current thereof is increased.

SUMMARY OF THE INVENTION

A first object of the present invention is to provide a semiconductor memory device capable of suppressing an increase of a gate capacitance of a substitution address program circuit connected to an address bus and suppressing an increase of time from a time instance when an address signal is input to a time instance when a reduncancy selection signal is output, by reducing a size of an N channel transistor to which the address signal is input.

A second object of the present invention is to provide a semiconductor memory device capable of reducing charge/discharge current of a substitution address program circuit even if a memory capacity thereof is increased and the number of the substitution address program circuits is increased correspondingly.

In order to achieve the objects mentioned above, the present invention provides a semiconductor memory device comprises means capable of programming an address containing a defect and means having a node adapted to swing between a first potential lower than a source potential and higher than a reference potential set between the source potential and a ground potential and a second potential lower than the reference potential and higher than the ground potential for determining coincidence or non-coincidence of an input address with the program address by comparing the potential of said node with the reference potential and for producing an output signal according to a result of the determination.

In the semiconductor constructed according to the present invention, an increase of a gate capacitance of a substitution address program circuit connected to an address bus and an increase of time from a time instance when an address signal is input to a time instance when a redundancy selection signal is output the restricted. Further, charge/discharge current in the substitution address program circuit is reduced. This corresponds to reduction of both C and V in the equation (1).

DETAILED DESCRIPTION OF THE PREFERRED EMBODIMENTS

An embodiment of the present invention will be described with reference to the drawings.

Figure 1:
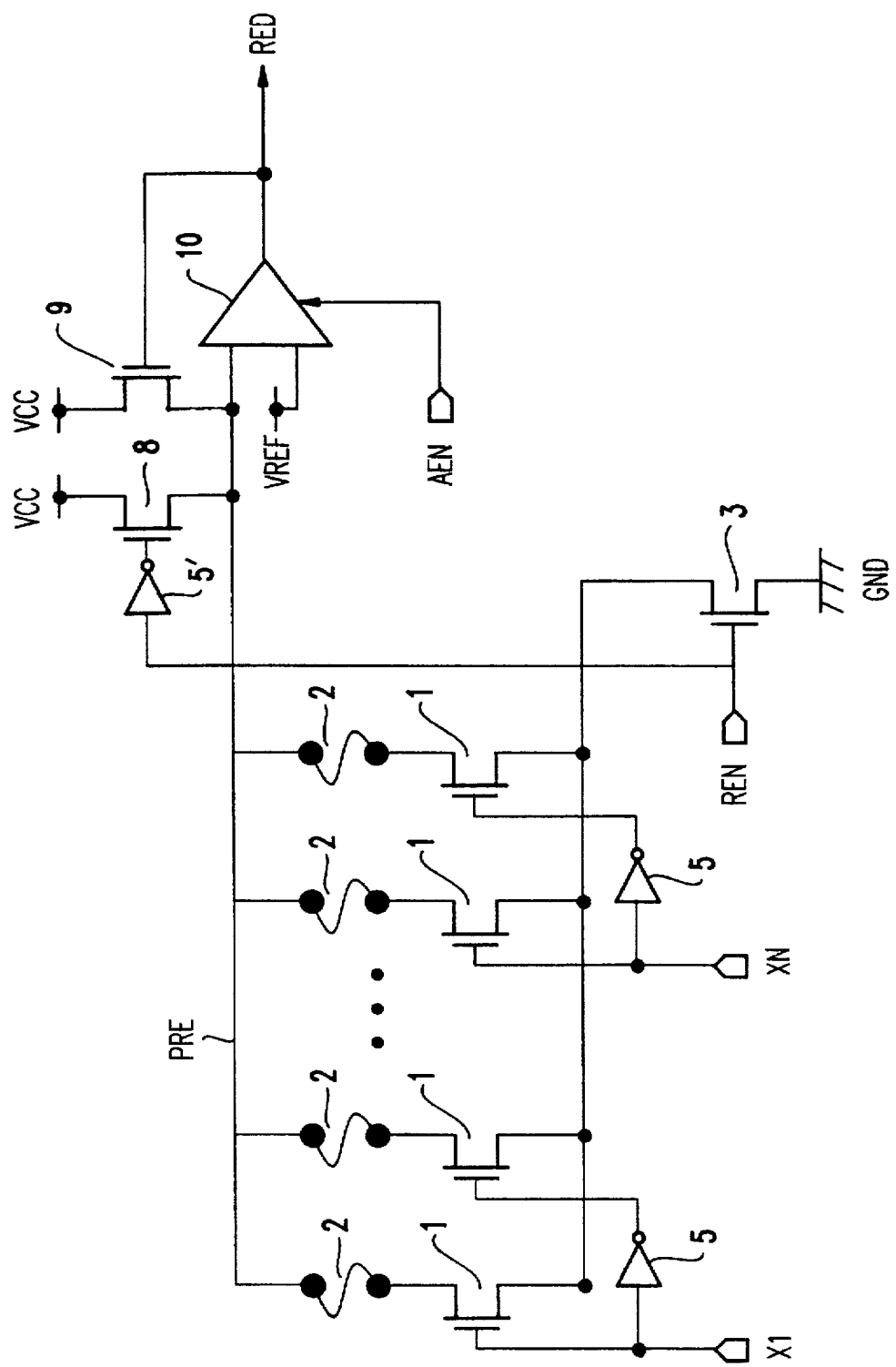
FIG. 1 is a circuit diagram showing a construction of an embodiment of the present invention.

FIG. 1 is a circuit diagram showing a construction of a substitution address program circuit according to an embodiment of the present invention.

Referring to FIG. 1, the substitution address program circuit according to the present invention comprises a plurality of pairs of N channel MOS transistors 1 provided for respective address signals X1~XN. Each paired N channel MOS transistors 1 have gate electrodes supplied with an associated address signals and an inverted signal of the associated address signal, respectively. The substitution address program circuit further comprises fuses 2 each provided between drain electrode of the N channel MOS transistor 1 and a common line (node PRE), an N channel MOS transistor 3 connected between commonly connected source electrodes of the N channel MOS transistors 1 and a ground GND and having a gate electrode supplied with an activation signal REN and N channel MOS transistors 8 and 9 provided between a source terminal VCC and the node PRE.

A plurality of series connections of the fuse and N channel MOS transistor constitutes an address detection circuit that is programmed by input addresses associated to defective cell addresses. The N channel MOS transistor 8 has a gate electrode supplied with a signal which is obtained by inverting the activation signal REN by an inverter 5'.

The substitution address program circuit further comprises a differential amplifier 10 having input terminals supplied with a potential of the node PRE and a reference voltage VREF, respectively. The differential amplifier 10 is activated for outputting RED according to the input signal level when a activation signal AEN is 'L' level. On the other hand, the differential amplifier 10 output "L" level as the RED when AEN is in "H" state. The selection signal RED is supplied to a gate electrode of the N channel MOS transistor 9. The N channel MOS transistor 9 is turned on when the selection signal RED is in a "H" level to prevent the node PRE from floating and has a current drive performance which may be small enough compared with that of the N channel MOS transistor 1.

Similarly to the conventional substitution address program circuit, the substitution address program circuit is programmed by preliminarily breaking some of the fuse 2 such that, when an address to be substituted is input, the redundancy selection signal RED becomes "H" level indicating the selection state.

An operation of the substitution address program circuit according to the embodiment shown in FIG. 1 will be described with reference to FIGS. (2A)–(2B) which show timing waveforms.

First, by making the activation signal REN "L" level, the gate electrode of the N channel MOS transistor 8 is supplied with a "H" level from the inverter 5' and the transistor 8 is turned on. In this case, the N channel MOS transistor 3 is turned off since the gate electrode thereof is supplied with "L" level. Therefore, the node PRE is pre-charged to a voltage (VCC–VTN) as "H" level, where VCC is the source potential and VTN is a gate threshold voltage of the N channel MOS transistor.

Since the activation signal AEN is made "H" level at this time, the redundancy selection signal RED becomes "L" level indicating the non-selection state. Details of the circuit construction of the differential amplifier 10 will be described later with reference to FIG. 3.

Figure 2A:
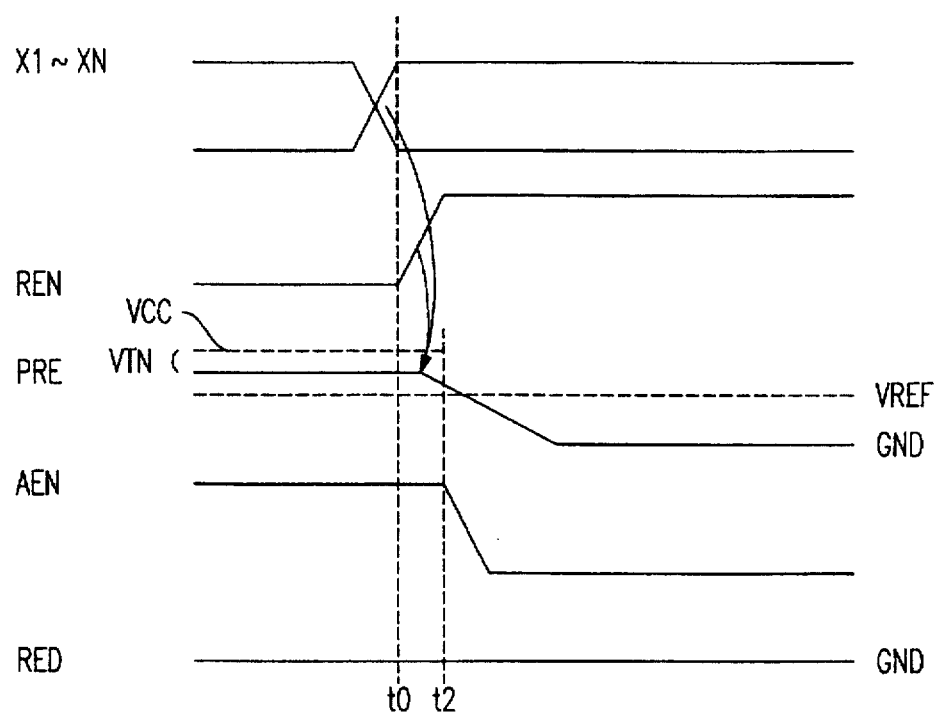
FIGS. 2A–2B show timing charts of an operation of the embodiment shown in FIG. 1.
Figure 2B:
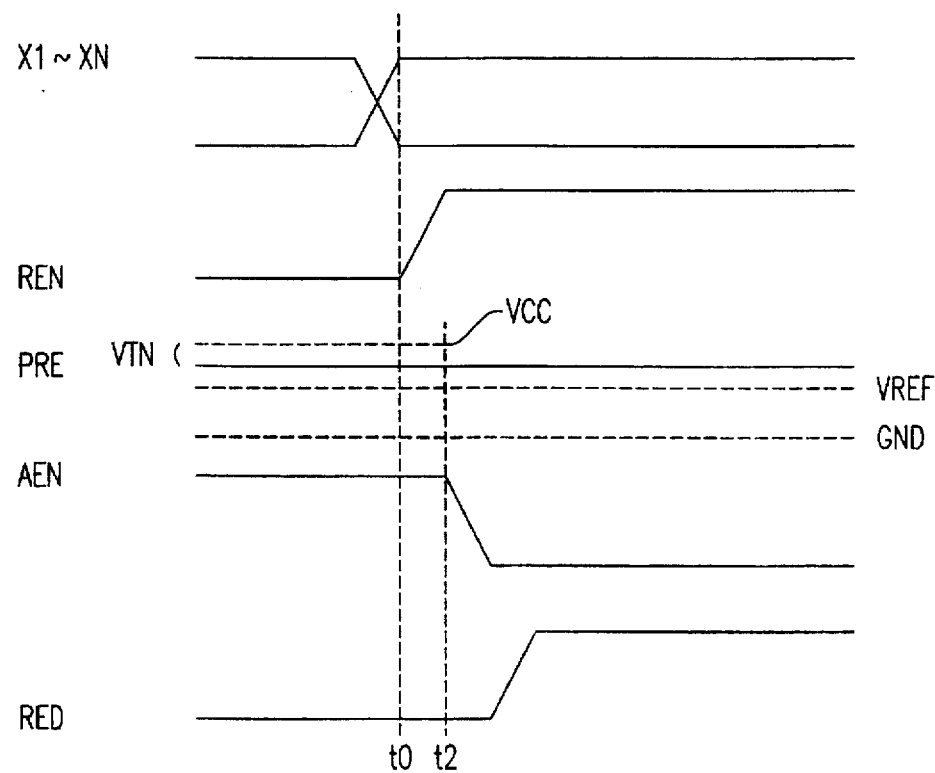

Then, when the address signals X1–XN are input to the substitution address program circuit at a time instance t0 in FIGS. 2A–2B, the redundancy selection signal REN become "H" level as shown in FIGS. 2A–2B.

At this time, in a case that the substitution address program circuit is set such that the input address coincides with the programmed address in the substitution address program circuit, the N channel MOS transistors 1 connected to the fuses which are not broken are turned off. Therefore, the node PRE is maintained at "H" level (cf. FIG. 1 and FIG. 2(B)).

Next, when a differential amplifier activation signal AEN is made "L" level at a time instance t2, the differential amplifier 10 determines that the potential of the node PRE is higher than the reference potential VREF. Therefore, amplifier 10 output the "H" level, indicating the selection state (cf. FIG. 2(B)). The time instance t2 is determined by a manner as described later.

On the other hand, when the input address is not coincident with any program address in the substitution address program circuit or when there is no programmed address in the substitution address program circuit, at least one of the N channel MOS transistors 1 connected to the fuses which are not broken is turned on and the N channel MOS transistor 3 is also turned on. Therefore, the node PRE is connected to the ground terminal GND and becomes "L" level.

At the time instance t2, the differential amplifier activation signal AEN becomes "L" level, so that the differential amplifier 10 is activated to determine that the node PRE is "L" level and outputs the redundancy selection signal RED in "L" level indicating the non-selection state (cf. FIG. 2(A)).

The time instance t2 must be designed as time point after which the node PRE becomes in the same level as that of the reference potential VREF when the node PRE is shifted from the "H" level to the "L" level. Here, the level of VREF is able to be at any level between (VCC–VTN) and the ground level. Therefore, the level of VREF can be set higher level than that of VTN. Thus, the timing t2 can be set to smaller than the timing t1 of conventional circuit discussed before. Thus, it is possible for the substitution address program circuit to shorten the address detection time thereof. Further, even if the N channel MOS transistors 1 are scaled down so that their discharging power are decreased and therefore, discharging speed of the node PRE is slowed down, the address detection time is not prolonged by setting VREF to enough higher than VTN.

Figure 3:
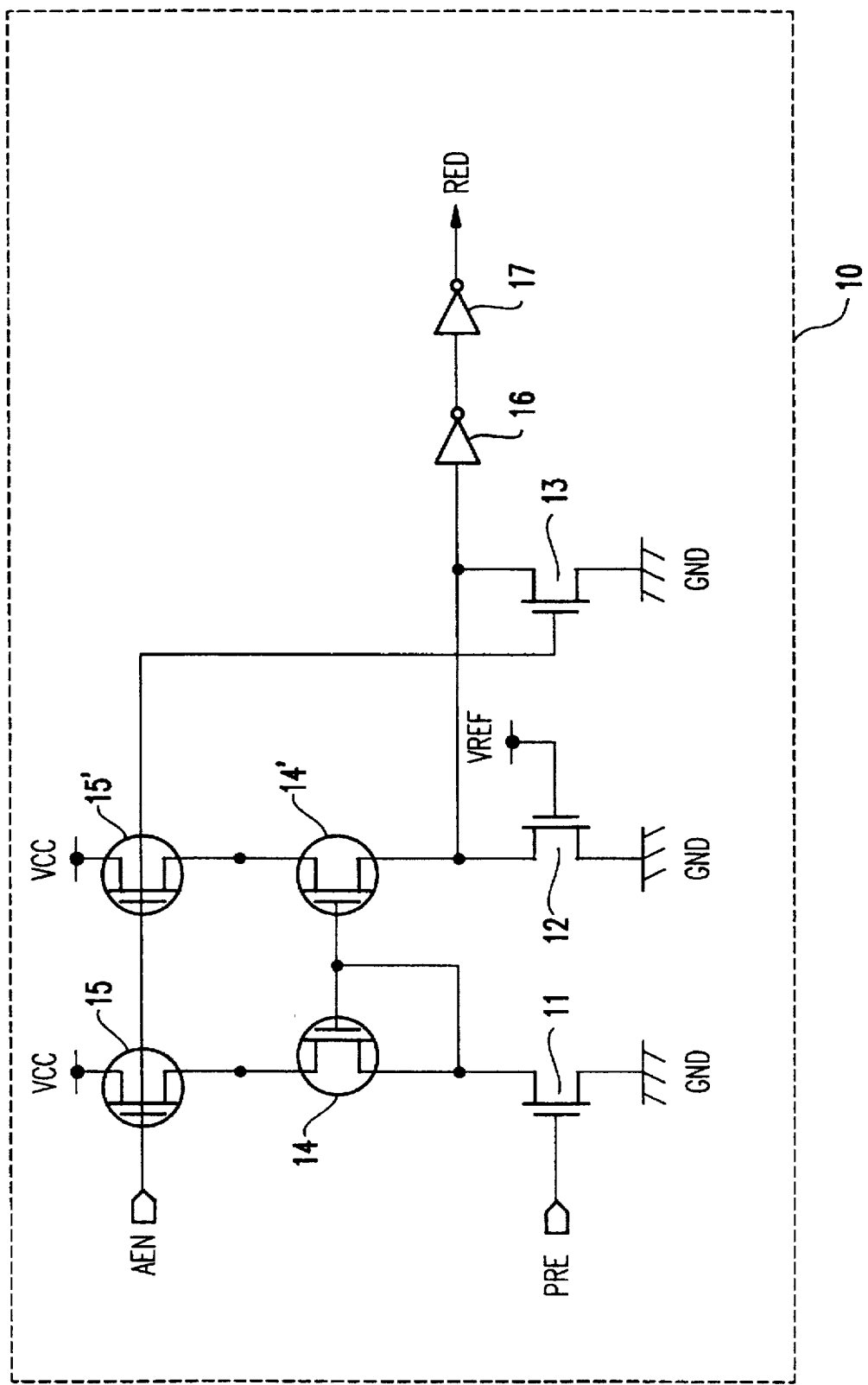
FIG. 3 shows a construction of an embodiment of a differential amplifier shown in FIG. 1.

Now, the differential amplifier 10 will be described in detail with reference to FIG. 3. The differential amplifier 10 comprises a first N channel MOS transistor 11 having a gate electrode connected to the node PRE and a source grounded, a second N channel MOS transistor 12 having a gate electrode connected to the reference potential VREF and a source grounded, a current mirror circuit composed of P channel MOS transistors 14 and 14' having an input terminal and an output terminal which are connected to drain electrodes of the respective first and second N channel MOS transistors 11 and 12 which constitute a differential input transistor pair, P channel MOS transistors 15 and 15' connected between the current mirror circuit and the voltage source terminal VCC and having gate electrodes commonly supplied with the differential amplifier activation signal AEN and an N channel MOS transistor 13 connected between a junction between the drain of the P channel MOS transistor 14' which is the output terminal of the current mirror circuit and the drain of the N channel MOS transistor 12 and the ground GND and having a gate electrode supplied with the differential amplifier activation signal AEN. An output potential of the differential input transistor pair, that is, the drain potential of the N channel MOS transistor 12, is derived through a series connection of a first and second inverters 16 and 17 as the output RED of the differential amplifier 10.

In this differential amplifier 10, when the differential amplifier activation signal AEN is in "H" level, the P channel MOS transistors 15 and 15' are turned off and the N channel MOS transistor 13 is turned on. Therefore, the input potential of the inverter 16 becomes "L" level and the output RED becomes "L" level.

When the differential amplifier activation signal AEN is in "L" level, the P channel MOS transistors 15 and 15' are turned on and serve as current sources and the N channel MOS transistor 13 is turned off.

In this case, when the potential of the node PRE is higher than the reference voltage VREF, current flowing through the P channel MOS transistor 14 is increased, the drain potential of the second N channel MOS transistor 12 is increased and the output RED derived through the inverters 16 and 17 becomes "H" level.

On the other hand, when the potential of the node PRE is lower than the reference voltage VREF, current flowing through the P channel MOS transistor 14 is decreased while current flowing through the P channel MOS transistor 14' is increased. Therefore, the drain potential of the second N channel MOS transistor 12 is lowered and the output RED derived through the inverters 16 and 17 becomes "L". Here, it is possible to reduce the size of each of the transistors constituting the differential amplifier by reducing the size of the first stage inverter 16 so that power consumption thereof can be restricted.

Further, when a circuit for latching the signal RED is provided at a later stage of the substitution address program circuit, it is possible to deactivate the differential amplifier 10 after the coincidence determination of the address. By deactivating the differential amplifier 10 in this manner, it is possible to decrease the current consumption of the differential amplifier 10.

Figure 4:
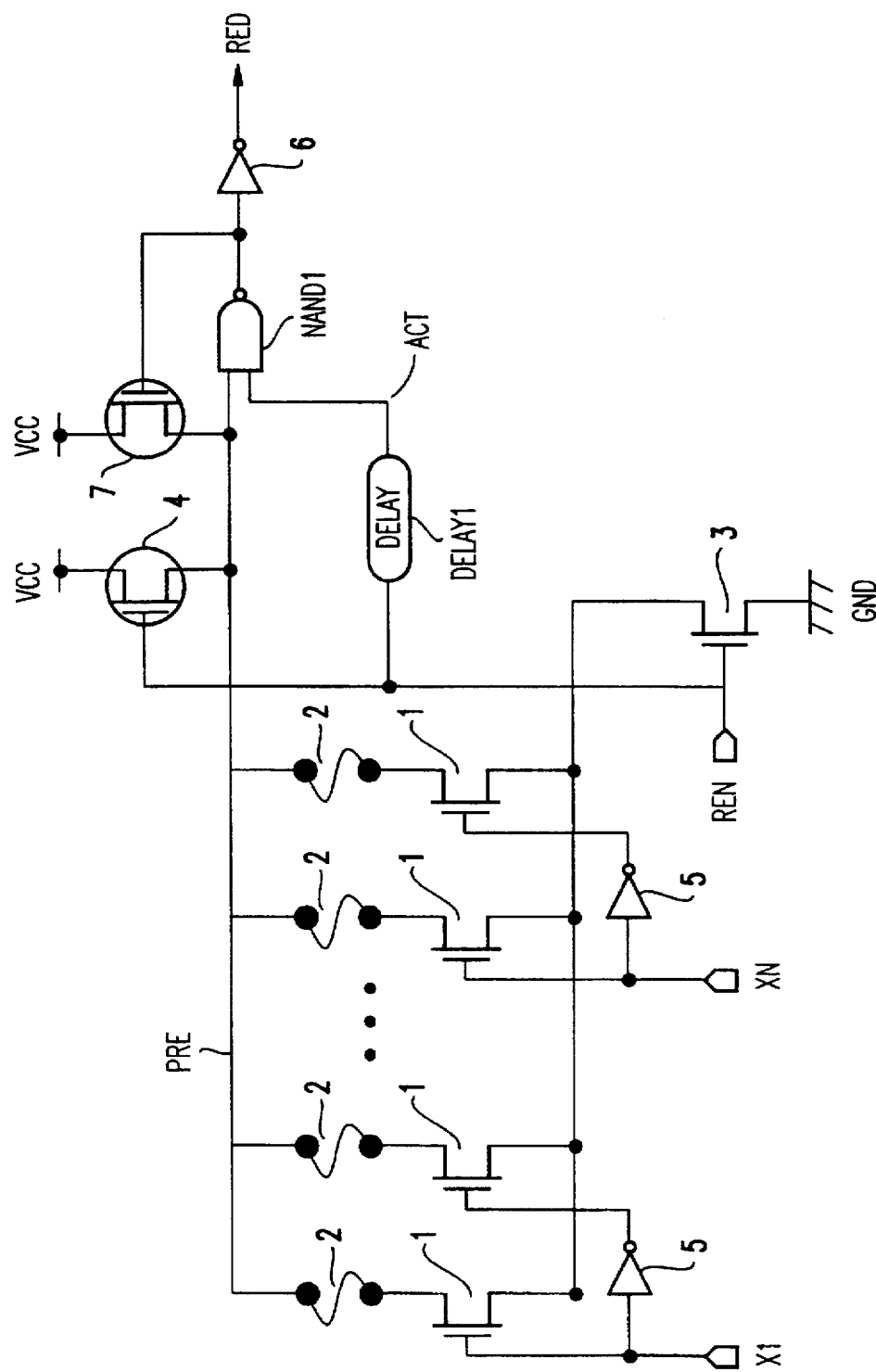
FIG. 4 is a circuit diagram of an example of a conventional substitution address program circuit.
Figure 5A:
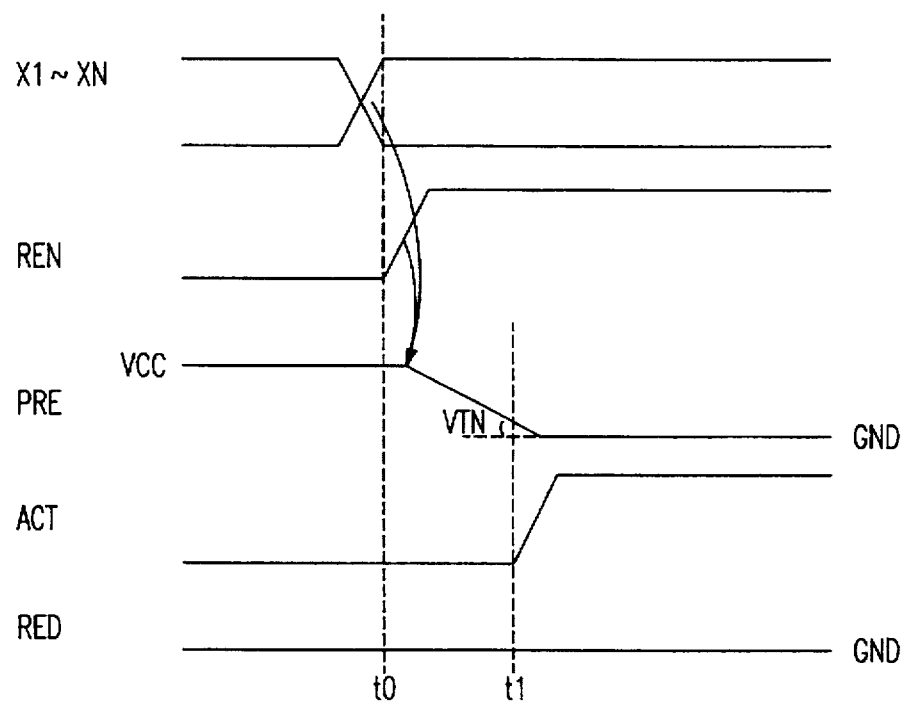
FIGS. 5A–5B show timing charts of an operation of the conventional substitution address program circuit shown in FIG. 5.
Figure 5B:
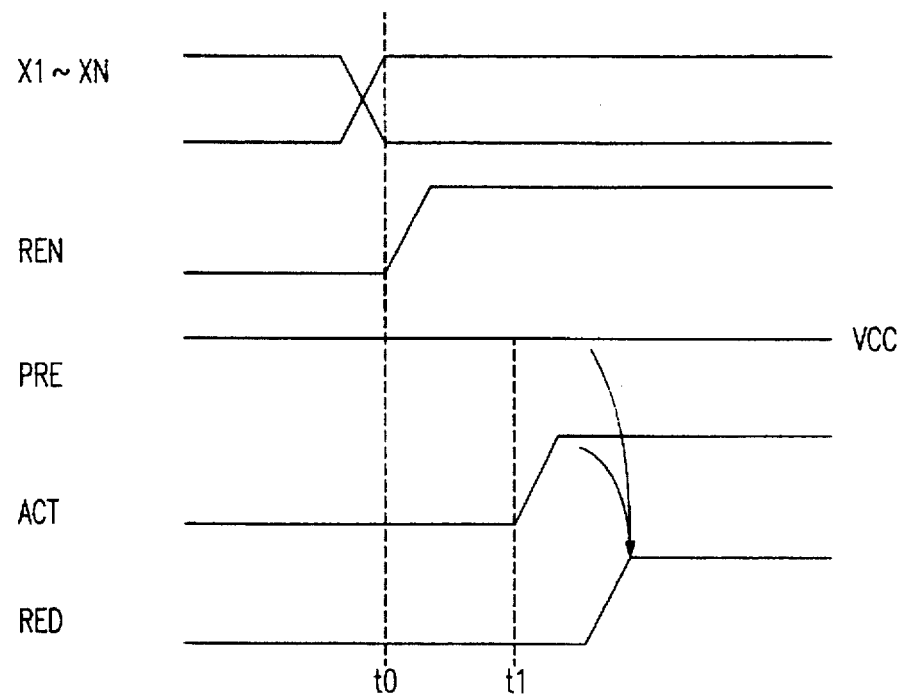

Further, since, in this embodiment, the node PRE swings between the potential VCC-VTN and the ground potential GND, it is possible to reduce the charge/discharge current compared with that of the conventional substitution address program circuit shown in FIG. 4.

As described hereinbefore, since the increase of the gate capacitance of the substitution address program circuit connected to the address bus is suppressed by reducing channel width of the N channel transistors, the charge/discharge current in the substitution address program circuit is possible to reduce.

What is claimed is:

1. A semiconductor memory devices equipped with a redundancy circuit which produces a redundancy selection signal indicative of whether or not an input address is coincident with a programmed address, said redundancy circuit comprising:

an address detection circuit having said programmed address and supplied with said input address, said address detection circuit generating a first voltage level at an output node thereof when said input address is coincident with said programmed address and a second voltage level at said output node when said input address is not coincident with said programmed address; and a differential circuit having a first input terminal connected to said output node of said address detection circuit, a second input terminal supplied with a reference voltage and an output terminal from which said redundancy selection signal is derived, said reference voltage having an intermediate level between said first voltage level and said second voltage level.

2. The semiconductor memory device as claimed in claim 1, wherein said reference voltage is greater than a threshold voltage of a MOS transistor fabricated in said memory device.

3. The semiconductor memory device as claimed in claim 1, wherein said deferential circuit includes a switching element coupled between a power supply line and said first input terminal and controlled to be turned ON by said redundancy selection signal indicative of said input address being coincident with said programmed address and turned OFF by said redundancy selection signal indicative of said input address being not coincident with said programmed address, said switching element being further controlled to be turned OFF when said input address changes a content thereof.

4. The semiconductor memory device as claimed in claim 1, wherein said differential circuit includes:

a first MOS transistor of a source-common type having a gate connected to said first input terminal;

a second MOS transistor of a source-common type having a gate connected to said second input terminal;

a current mirror circuit coupled between drains of said first and second MOS transistors; and means for coupling one of the drains of said first and second MOS transistors to said output terminal.

5. The semiconductor memory device as claimed in claim 4, wherein said differential circuit further includes a third MOS transistor coupled in series to said MOS first transistor and a fourth MOS transistor coupled in series to said second MOS transistor, each of said third and fourth MOS transistor being rendered conductive by an activation control signal to activate said differential circuit.

6. The semiconductor memory device as claimed in claim 3, wherein said switching element comprises a MOS transistor having a drain connected to said power supply line, a source connected to said first input terminal and a gate connected to said output terminal.

7. The semiconductor memory device as claimed in claim 5, said differential circuit further includes a fifth MOS transistor coupled in parallel to said second MOS transistor and controlled by said activation control signal.

8. A semiconductor memory device with a substitution address program circuit comprising:

an address detection circuit having a first and second nodes and outputting a first voltage level to said first node when said address detection circuit receives input addresses which coincide with addresses programmed previously in said address detection circuit and a second voltage level to said first node when said address detection circuit receives input addresses which do not coincide with said addresses programmed previously in said address detection circuit;

a N channel pre-charge transistor, for pre-charging said first node of said address detection circuit to said first voltage level before said input addresses being inputted to said address detection circuit, connected between a voltage power source and said first node of said address detection circuit;

a second N channel transistor connected between said second node of said address detection circuit and ground voltage level, said second N channel transistor being set to an OFF state before said input addresses being inputted to said address detection circuit and an ON state after said input addresses being inputted to said address detection circuit; and a differential amplifier having a first input terminal connected to said first node of said address detection circuit and a second input terminal connected to a reference voltage level, said reference voltage level being between said first voltage level and said second voltage level.

9. The semiconductor memory device as claimed in claim 8, wherein said reference voltage level is greater than a threshold voltage of a MOS transistor fabricated in said memory device and lower than said first voltage level.

10. The semiconductor memory device as claimed in claim 9, wherein said differiential amplifier is activated, in response to an activation signal being changed to a first level, for amplifying a differential signal appearing between said first and second input terminals and outputs a redundancy selection signal for indicating whether or not an address coinciding with said address programmed previously in said address detection circuit is inputted and deactivated for outputting a predetermined level as said redundancy selection signal when said activation signal is a second level.

11. The semiconductor memory device as claimed in claim 10, wherein said differential amplifier comprises:

a first P channel transistor having a source connected to said voltage power source, a gate connected to said activation signal and a drain;

a second P channel transistor having a gate and a drain connected to each other and a source connected to said drain of said first P channel transistor;

a third N channel transistor having a drain connected to said drain of said second P channel transistor, a gate connected to the output node of said address detection circuit and a source grounded;

a third P channel transistor having a source connected to said voltage power source, a gate connected to said activation signal and a drain;

a fourth P channel transistor having a source connected to said drain of said third P channel transistor, a gate connected to said gate of said second P channel transistor and a drain;

a fourth N channel transistor having a drain connected to said drain of said fourth P channel transistor, a gate connected to said reference voltage level and a source grounded; and a fifth N channel transistor having a drain connected to said drain of said fourth N channel transistor, a gate connected to said activation signal and a source grounded.

12. The semiconductor memory device as claimed in claim 11, wherein said activation signal is set to said first level after a time period required for an output level of said address detection circuit to cross said reference voltage level while said output level changing from a third voltage level to said second voltage level when said address detection circuit receives input addresses which do not coincide with said address programmed previously in said address detection circuit.

13. The semiconductor memory device as claimed in claim 8, further comprising a latch circuit for latching an output signal of said differential amplifier.

14. The semiconductor memory device as claimed in claim 12, wherein said address detection circuit comprises a plurality of series connections of a fuse and a N channel transistor, each of said series connections being connected in parallel with each other and connected between said first node and said second node.

15. A semiconductor memory device comprising a power line supplied with a power potential, first and second nodes, a precharging circuit coupled to said power line and said first and second nodes, said precharging circuit responding to a precharge control signal and precharging said first node to a first voltage that is lower than said power potential and said second node to a reference potential, an address detection circuit coupled between said first and second nodes and forming an electrical path therebetween when an input address is coincident with a programmed address, said address detection circuit maintaining an electrical isolation between said first and second nodes when said input address is non-coincident with said programmed address, and a comparator coupled to said first node and supplied with a second voltage that has an intermediate potential between said power and reference potentials, said comparator comparing a potential to said first node with said second voltage.

16. The device as claimed in claim 15, wherein said precharging circuit includes a transistor having a drain connected to said power line, a source connected to said first node and a gate connected to receive said precharge control signal.

* * * * *